US006816797B2

(12) United States Patent
Freeman et al.

(10) Patent No.: US 6,816,797 B2
(45) Date of Patent: Nov. 9, 2004

(54) SYSTEM AND METHOD FOR MEASURING FUEL CELL VOLTAGE AND HIGH FREQUENCY RESISTANCE

(75) Inventors: Norman A. Freeman, Richmond Hill (CA); Stéphane Massé, Toronto (CA); Ravi B. Gopal, Oakville (CA)

(73) Assignee: Hydrogenics Corporation, Mississauga (CA)

( * ) Notice: Subject to any disclaimer, the term of this patent is extended or adjusted under 35 U.S.C. 154(b) by 142 days.

(21) Appl. No.: 10/109,003

(22) Filed: Mar. 29, 2002

(65) Prior Publication Data

US 2002/0196025 A1 Dec. 26, 2002

Related U.S. Application Data

(63) Continuation-in-part of application No. 09/672,040, filed on Sep. 29, 2000, now Pat. No. 6,519,539, and a continuation-in-part of application No. 09/865,562, filed on May 29, 2001, now abandoned.

(51) Int. Cl.[7] ............................................. G01N 27/416
(52) U.S. Cl. ..................... 702/65; 324/434; 340/636.16
(58) Field of Search ................................. 324/426, 429, 324/434, 435; 340/636.1, 636.11, 636.12, 636.13, 636.15, 636.16, 636.21; 320/120, 116, 101; 702/64, 65, 57

(56) References Cited

U.S. PATENT DOCUMENTS

| | | |
|---|---|---|
| 3,676,770 A | 7/1972 | Sharaf et al. |
| 3,753,094 A | 8/1973 | Furuishi et al. |
| 4,071,819 A | 1/1978 | De Santis |
| 4,316,185 A | 2/1982 | Watrous et al. |
| 4,352,067 A * | 9/1982 | Ottone ........................ 324/434 |
| 4,484,140 A | 11/1984 | Dieu |
| 4,697,134 A | 9/1987 | Burkum et al. |
| 4,743,855 A | 5/1988 | Randin et al. |
| 4,972,181 A * | 11/1990 | Fiene ..................... 340/636.16 |

(List continued on next page.)

FOREIGN PATENT DOCUMENTS

| | | |
|---|---|---|
| JP | 359215674 | 12/1984 |
| JP | 2000092732 | 3/2000 |
| WO | WO 99/18448 | 4/1999 |
| WO | WO 00/31557 | 6/2000 |
| WO | WO 01/09631 | 2/2001 |
| WO | WO 01/14898 A1 | 3/2001 |
| WO | WO 02/03086 A2 | 1/2002 |
| WO | WO 02/27342 A2 | 4/2002 |

OTHER PUBLICATIONS

Elsener, B. and H. Bohni, "Computer–Assisted D.C. and A.C. Techniques In Electrochemical Investigations Of The Active–Passive Transition", Corrosion Science, vol. 23, No. 4, pp. 341–352, 1983, printed in Great Britain.

(List continued on next page.)

*Primary Examiner*—Marc S. Hoff
*Assistant Examiner*—Paul L Kim
(74) *Attorney, Agent, or Firm*—Bereskin & Parr

(57) ABSTRACT

A method and apparatus are provided for measuring impedance and voltage characteristics of cells of multi-cell electrochemical devices, for example a battery or a fuel cell stack. Voltages are measured across individual cells, or groups of cells. At the same time, a load is connected in series with the electrochemical device. Both the device for measuring the voltages and the load are controlled together, preferably by means of a controller, which can include some form of microprocessor. This enables the load to be controlled to provide a desired combination of DC and AC current characteristics. By setting appropriate DC and AC current characteristics, desired characteristics of the impedance of individual cells can be measured.

16 Claims, 3 Drawing Sheets

U.S. PATENT DOCUMENTS

| | | |
|---|---|---|
| 5,047,722 A | 9/1991 | Wurst et al. |
| 5,170,124 A | 12/1992 | Blair et al. |
| 5,281,920 A * | 1/1994 | Wurst .......................... 324/430 |
| 5,416,416 A * | 5/1995 | Bisher ......................... 324/426 |
| 5,608,307 A * | 3/1997 | Garrett et al. ............... 320/163 |
| 5,670,861 A * | 9/1997 | Nor ............................ 320/118 |
| 5,712,568 A | 1/1998 | Flohr et al. |
| 5,773,978 A | 6/1998 | Becker |
| 5,914,606 A | 6/1999 | Becker-Irvin |
| 5,923,148 A | 7/1999 | Sideris et al. |
| 6,002,238 A | 12/1999 | Champlin |
| 6,011,379 A | 1/2000 | Singh et al. |
| 6,037,777 A | 3/2000 | Champlin |
| 6,140,820 A | 10/2000 | James |
| 6,160,382 A | 12/2000 | Yoon et al. |
| 6,239,579 B1 * | 5/2001 | Dunn et al. ................. 320/121 |
| 6,281,684 B1 | 8/2001 | James |
| 6,297,618 B2 | 10/2001 | Emori et al. |
| 6,313,750 B1 | 11/2001 | Lacy |
| 6,335,611 B1 | 1/2002 | Sasaki |
| 6,406,806 B1 | 6/2002 | Keskula et al. |
| 6,432,569 B1 | 8/2002 | Zeilinger et al. |
| 6,455,180 B1 | 9/2002 | Mowery et al. |
| 2002/0051899 A1 | 5/2002 | Keskula et al. |

OTHER PUBLICATIONS

Selman, J. R., and Y.P. Lin, "Application Of ac Impedance In Fuel Cell Research and Development", Electrochemica Acta, vol. 38, No. 14, pp. 2063–2073, 1993, printed in Great Britain.

Springer, T.E., et al., "Characterization of Polymer Electrolyte Fuel Cells Using AC Impedance Spectroscopy", J. Electrochem. Soc., vol. 143, No. 2, Feb. 1996, pp. 587–599.

* cited by examiner

SYSTEM AND METHOD FOR MEASURING FUEL CELL VOLTAGE AND HIGH FREQUENCY RESISTANCE

The present application is a continuation-in-part of earlier U.S. patent application Ser. No. 09/672,040 filed Sep. 29, 2000, now U.S. Pat. No. 6,519,539 and Ser. No. 09/865,562, filed May 29, 2001 now abandoned.

FIELD OF THE INVENTION

The present invention relates to a system and method for measuring voltage and high frequency resistance of fuel cell stacks. More particularly, the present invention relates to system and method for measuring individual cell voltages and resistance of a fuel cell stack in which cells are stacked in series.

BACKGROUND OF THE INVENTION

A fuel cell is an electrochemical device that produces an electromotive force by bringing the fuel (typically hydrogen) and an oxidant (typically air) into contact with two suitable electrodes and an electrolyte. A fuel, such as hydrogen gas, for example, is introduced at a first electrode where it reacts electrochemically in the presence of the electrolyte to produce electrons and cations in the first electrode. The electrons are circulated from the first electrode to a second electrode through an electrical circuit connected between the electrodes. Cations pass through the electrolyte to the second electrode. Simultaneously, an oxidant, such as oxygen or air is introduced to the second electrode where the oxidant reacts electrochemically in presence of the electrolyte and catalyst, producing anions and consuming the electrons circulated through the electrical circuit; the cations are consumed at the second electrode. The anions formed at the second electrode or cathode react with the cations to form a reaction product. The first electrode or anode may alternatively be referred to as a fuel or oxidizing electrode, and the second electrode may alternatively be referred to as an oxidant or reducing electrode. The half-cell reactions at the two electrodes are, respectively, as follows:

$$H_2 \rightarrow 2H^+ + 2e^-$$

$$\tfrac{1}{2}O_2 + 2H^+ + 2e^- \rightarrow H_2O$$

The external electrical circuit withdraws electrical current and thus receives electrical power from the cell. The overall fuel cell reaction produces electrical energy as shown by the sum of the separate half-cell reactions written above. Water and heat are typical by-products of the reaction.

In practice, fuel cells are not operated as single units. Rather, fuel cells are connected in series, stacked one on top of the other, or placed side by side. A series of fuel cells, referred to as fuel cell stack, is normally enclosed in a housing. The fuel and oxidant are directed through manifolds to the electrodes, while cooling is provided either by the reactants or by a cooling medium. Also within the stack are current collectors, cell-to-cell seals and insulation, with required piping and instrumentation provided externally of the fuel cell stack. The stack, housing, and associated hardware make up the fuel cell module.

Various parameters have to be monitored to ensure the proper operation of a fuel cell stack and evaluate the performance thereof. These parameters include the voltage across each fuel cell in the fuel cell stack, hereinafter referred to as cell voltage, and the internal resistance of each fuel cell.

The literature indicates that complex impedance measurements on fuel cells can only be performed using expensive bench-top laboratory equipment, consisting of may subsystems interfaced with on another. For example, T. E. Springer, T. A. Zawodzinski, M. S. Wilson and S. Gottesfield, "Characterization of polymer electrolyte fuel cells using AC impedance spectroscopy", Journal of the electrochemical Society of America, 143(2), p. 587–599, 1996; J. R. Selman and Y. P. Lin, "Application of AC impedance in fuel cell research and development", Electrochemica Acta, 38(14), p. 2063–2073, 1993; B. Elsener and H. Bolmi, "Computer-assisted DC and AC techniques in electrochemical investigations of the active-passive transition", Corrosion Science, 23(4), p. 341–352, 1983. Such known equipment is manually controlled, with no automation in place. No single known approach allows the use of a portable, integrated measurement system. In addition, no measurement equipment is integrated into these systems which permits modification of fuel cell operating parameters.

Furthermore, the patent literature shows that the measurement of complex impedance is primarily known for use on batteries. In addition, these patents only teach techniques for measuring a single quantity, namely "impedance" (U.S. Pat. Nos. 4,697,134 and 5,773,978) or "resistance" (U.S. Pat. Nos. 3,753,094, 3,676,770 and 5,047,722). The previously mentioned patent relating to measuring impedance of an electrochemical cell (U.S. Pat. No. 6,002,238), not necessarily a fuel cell, used an entirely different, yet complicated approach. Furthermore, this approach could not be directly applied to fuel cells due to high currents associated with the latter.

Thus, there are still issues that need to be addressed, such as portability, fuel cell applicability, measurement variety, resolution, automation and cost. These issues have been addressed, to some extent, in the assignee's co-pending U.S. patent application Ser. No. 09/672,040 that provides a self-contained, portable apparatus/system for measuring fuel cell impedance and a method of the same. The system comprises a CPU, frequency synthesizer, a fuel cell, a load bank and measurement and acquisition circuitry. The CPU receives input parameters from a software program and sends the parameters to a signal generation device which produces an AC waveform with a DC offset that is used to remotely program a load bank. The load bank draws current from the fuel cell. The voltage across the fuel cell and the current through the fuel cell are measured by voltage and current sensing circuitry, then digitized and averaged by an oscilloscope or A/D converter. The recorded data is sent to the CPU where the AC phase lead or lag is calculated. Numerous outputs can then be displayed by the invention, including real impedance, imaginary impedance, phase difference, leading component, lagging component, current magnitude, voltage magnitude and applied AC voltage.

However, the invention of that earlier application has limited application in measurement of fuel cell stacks consisting of a large number of fuel cells, where voltage measurement may be difficult using conventional measuring devices. A scheme for measuring the internal resistance of individual fuel cells within a fuel cell stack in a real-time manner is not detailed in the previous patent application.

In order to measure cell voltages, differential voltage measurement is required at the two terminals (i.e. anode and cathode) of each fuel cell. However, since fuel cells are connected in series, and typically in large number, the voltages at some terminals will be too high for any currently available semiconductor measuring device to directly measure. For example, for a fuel cell stack consisting of 100 cells with each cell voltage at 0.95 V, the actual voltages on the negative terminal (cathode) of the top cell will be 94.05 V (i.e. 0.95*100−0.95). As such, the voltage exceeds the maximum allowable input voltage of most current differential amplifiers commonly used for measuring voltage.

The assignee's co-pending U.S. patent application Ser. No. 09/865,562 provides a solution for this problem. This patent application provides a system for monitoring cell voltages of individual fuel cells in a fuel cell stack; the contents of both U.S. patent application Ser. Nos. 09/865,562 and 09/672,040 are hereby incorporated by reference. The system comprises a plurality of differential amplifiers, a multiplexer, an analog to digital converter, a controller and a computer. Each of the differential amplifiers reads the voltages at two terminals of each fuel cell. The analog to digital converter reads the output of the differential amplifiers via the multiplexer, which provides access to one of these differential amplifiers at any given time. The digital output of the analog to digital converter is then provided to the computer for analysis. The computer controls the operation of the analog to digital converter and the multiplexer. However, the voltage monitoring system in this patent application only measures the DC voltage across individual fuel cells. In contrast, in the aforementioned U.S. patent application Ser. No. 09/672,040, the measurement of fuel cell impedance involves applying both AC and DC voltages across a complete fuel cell stack, whether this is a single fuel cell or a stack of many fuel cells.

Therefore, there is still need for a system that is suitable for measuring internal resistance of individual fuel cells within a fuel cell stack, especially a stack consisting of a large number of fuel cells.

SUMMARY OF THE INVENTION

According to one aspect of the present invention, there is provided a system or apparatus for measuring fuel cell voltage and impedance. The apparatus comprises:

a voltage measuring means including a plurality of inputs for connection across a plurality of measuring points between cells of the electrochemical device, to generate voltage signals indicative of the measured voltages, the voltage measuring means providing a plurality of primary channels for the measured voltages, there being one channel for the voltage across adjacent measuring points; and wherein the voltage measuring means includes a channel splitter for separating out components of the measured voltages across adjacent measuring points from the primary channels, the channel splitter having first channels for providing DC components of the measured voltages and second channels for providing AC components of the measured voltages;

a load, connectable in series with the electrochemical device, and adapted to draw a DC current with a superimposed AC perturbation current; and, a controller connected to and controlling the voltage measuring means and the load, for controlling the characteristics of the load and for receiving the voltage signals from the voltage measuring means, wherein the controller is adapted to control the load to provide desired DC and AC load current characteristics.

Preferably, the voltage measuring means includes a plurality of instrumentation amplifiers connected to the inputs of the voltage measuring means and having outputs providing the plurality of the primary channels and an analog multiplexer connected to at least the first channels from the channel splitter, wherein a multiplex control line is connected between the controller and the analog multiplexer for controlling the analog multiplexer to switch sequentially between at least the first channels.

It will be understood that the voltage signals could simply be the actual voltage across each cell.

According to another aspect of the present invention, there is provided a method of monitoring the voltage and impedance characteristics of cells of a multi-cell electrochemical device, the method comprising:

(i) providing a load connected in series with the electrochemical device;

(ii) controlling the load to provide desired current characteristic, comprising a desired combination of a DC current and a superimposed AC current perturbation, according to a series of set load conditions;

(iii) measuring the voltage across a plurality of measuring points between cells of the electrochemical device by providing a plurality of primary channels, there being one channel for the voltage across adjacent measuring points, and separating out components of the measured voltages across adjacent measuring points from the primary channels by providing at least one first channel for obtaining DC components of the measured voltages and at least one second channel for obtaining AC components of the measured voltages; and (iv) recording at least some of the measured voltages.

For both aspects of the invention, the voltages measured need not be across each individual cell. It is possible that voltages could be measured across just some of the cells, and/or some individual voltages could be measured across a group of cells.

BRIEF DESCRIPTION OF THE DRAWINGS

For a bettering understanding of the present invention and to show more clearly how it may be carried into effect, reference will now be made, by way of example, to the accompanying drawings which show a preferred embodiment of the present invention and in which.

DETAILED DESCRIPTION OF THE PREFERRED EMBODIMENT

Figure 1:
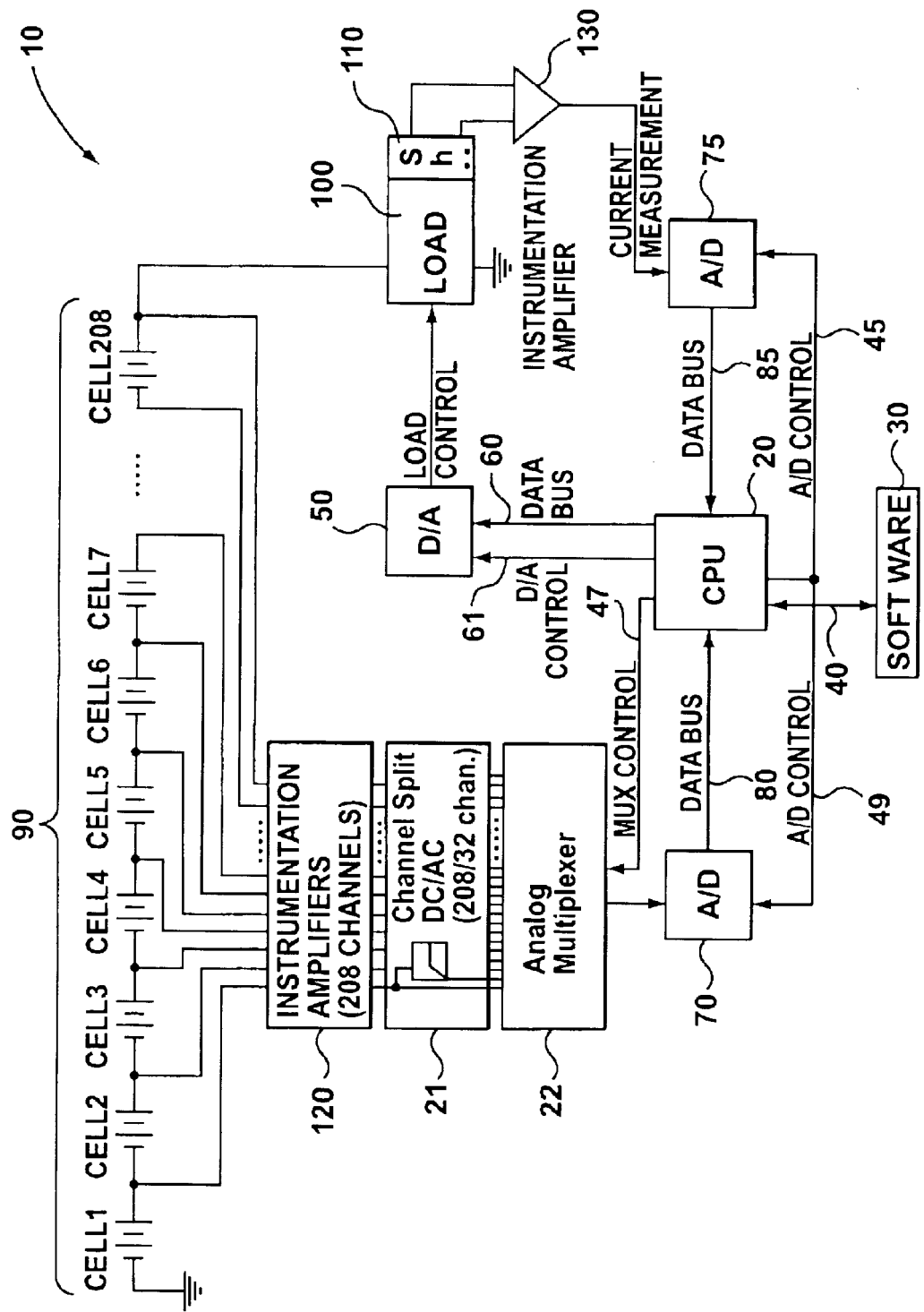
FIG. 1 is a schematic view of a system for measuring fuel cell voltage and resistance in accordance with a preferred embodiment of the present invention.

Reference is made to FIG. 1, which illustrates a preferred embodiment of a self-contained, portable apparatus 10 for impedance measurement of a fuel cell at discrete frequencies as described below. A CPU 20, accepts inputs from a software program 30 via one RS-232 serial link protocol or first data bus 40. Some inputs include frequency, AC amplitude, DC offset current and fuel cell active area. The CPU 20 sends the input parameters to a digital to analog (D/A) converter 50 via a second data bus 60, and is also connected by a control line 61. The CPU 20 receives data comprising the measured cell voltages across the fuel cell stack, i.e., the voltage across each individual fuel cells within the stack from a first voltage analog to digital (A/D) converter 70 via a third data bus 80. The CPU 20 also receives data comprising the measured current through the fuel cell stack from a second or current analog to digital (A/D) converter 75 via a fourth data bus 85. The CPU 20 then calculates various parameters of interest and outputs these parameters to the software 30 via the RS-232 serial link protocol 40. The output parameters include measured resistance, current magnitude, voltage magnitude and applied AC voltage. The voltage and current analog to digital converters 70,75 are controlled by control signals supplied through respective control lines 45, 49 connected to the CPU 20.

A test fuel cell stack is indicated at 90 and is connected in series with a load bank 100, with ground connections indicated in known manner. The load bank 100 is a standard load bank, which can be set to apply a desired voltage or draw a desired current. As detailed below, for current measuring purposes, a shunt 110 is provided in the circuit including the fuel cell stack 90 and the load bank 100, across the load bank 100.

In order to test the fuel cell stack 90 it is required for the output of the fuel cell stack to be a constant, DC level with a superimposed alternating level. Accordingly, the CPU 20 feeds the D/A converter 50 with data representing a DC value plus an AC perturbation. The D/A converter 50 in turn controls the load bank 100 to draw a desired, large DC current. The load bank 100 is further controlled by the D/A converter 50, to drawn an AC perturbation that is superimposed on the DC current and is generally relatively small. The perturbation waveform function may be stored in the CPU 20. This method is commonly referred to as a high frequency resistance measurement technique.

The cell voltages of individual fuel cells within the fuel cell stack 90 are measured directly using a bank of differential amplifiers 120, which will be described in detail below, and which generate voltage signals. These voltage signals are passed to a channel splitting device 21 for splitting into first channels for a DC component of the voltage signal and second channels for an AC component of the voltage signal. The first and second channels are then connected through an analog multiplexer 22 to the A/D converter 70. In contrast, the current through the fuel cell stack 90 is measured indirectly using the shunt 110. A shunt 110 has a known resistive value and near zero reactance component, and is connected across a purely resistant component of the load bank 100 in known manner. A differential amplifier 130 is connected to the shunt to measure the voltage drop across the shunt 110, and to generate a current measurement signal. Therefore, the current through the shunt 110, and hence the current through the fuel cell stack 90, can be obtained through calculation. The bank of differential amplifiers 120 can be in accordance with earlier U.S. patent application Ser. No. 09/865,562.

In this present system, the measured cell voltages of each fuel cell and the current passing through the fuel cell stack 90 are respectively digitized and averaged by the first A/D converter 70 and the second A/D converter 75. The first and second A/D converters 70, 75 in turn send the measured values in digital format to the CPU 20 (where they are stored for processing) via the third and fourth data buses 80 and 85. The CPU 20 uses this data to calculate the AC and DC voltages across individual fuel cells within fuel cell stack 90 and the measured current through the fuel cell stack 90. The CPU 20 then calculates the resistive components of the impedance of each fuel cell within the fuel cell stack 90. These calculations are done at a selected "spot" frequency. All these measurements and calculations are performed for each individual fuel cell. The real component at this frequency is a precise measure of the internal resistance of each fuel cell. The inventors have noted error levels of less than 1% in magnitude when this invention was compared to much more costly bench-top, non-integrated systems.

Figure 2:
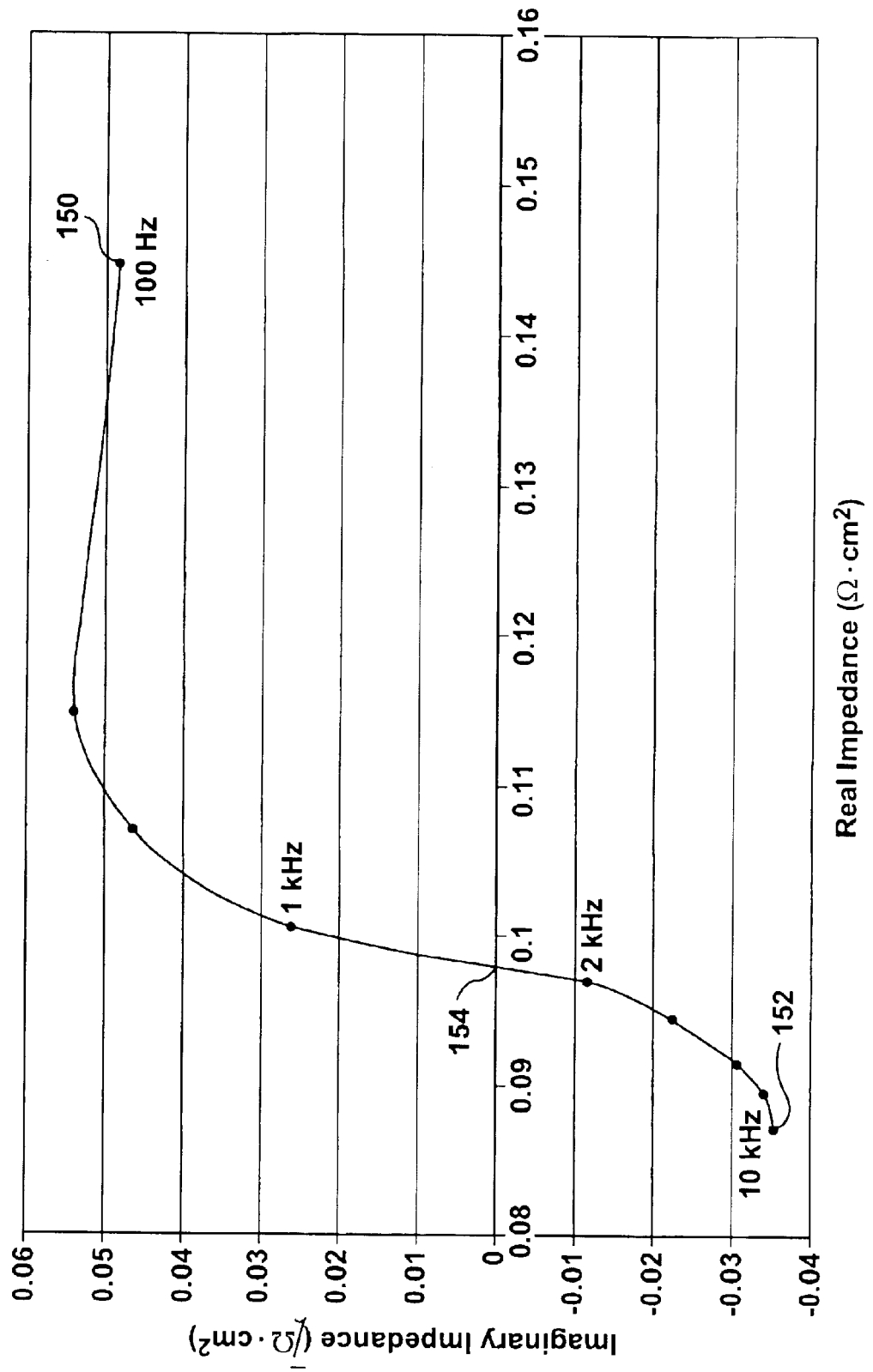
FIG. 2 is a Nyquist plot showing variation of real and imaginary impedance frequency obtained using the system of FIG. 1.

The "spot" frequency is selected using a Nyquist plot before the actual measurement. Reference will now be made to FIG. 2, which shows a exemplary Nyquist plot obtained using a frequency selecting device, such as the apparatus disclosed in the applicant's co-pending U.S. patent application Ser. No. 09/672,040. The horizontal axis shows real impedance in $\Omega cm^2$ and the vertical axis shows the imaginary impedance in $\Omega cm^2$. The values are determined by multiplying the actual impedance values by the surface area of the PEM of each cell in the stack 90. This then gives an indication of the impedance values for each unit area of each cell, independent of the cell area, i.e. just determined by cell characteristics. As shown, the plot shows the variation in resistance as frequency is varied from 100 Hz, as indicated at 150, through various points taken, including 1 KHz, 2 KHz, through to 10 KHz, indicate at 152. The first portion of the curve, for high frequencies, is below the horizontal axis, indicating a negative imaginary impedance, while the second portion (for lower frequencies) is above the axis, indicative of a positive imaginary impedance. Where the curve crosses the axis, i.e. where there is 0 imaginary impedance, indicated at 154, the real impedance is approximately 0.098 $\Omega cm^2$. As the imaginary component is 0, at this point, this is the value of the real component of the resistance. Before actual measurement, the frequency is selected so that the system only measures the real component of the impedance.

Now reference will be made to FIG. 3, which shows a partial schematic view of a cell voltage measurement on a fuel cell stack using the system shown in FIG. 1. The system comprises a plurality of differential amplifiers 62, 64, etc, (as indicated at 120) which are connected to a fuel cell stack 90. As shown in FIG. 1, the plurality of inputs of the differential amplifiers 62, 64, etc are connected to the terminals of the fuel cells in the fuel cell stack 90, while the plurality of outputs of the differential amplifiers 62, 64, etc are connected to a channel splitting dev 21 (shown in FIG. 1), which in turn has a plurality of outputs connected to a switching network 22, e.g. a multiplexer. The multiplexer 22 has one output connected to the first A/D converter 70 which converters the analog data from the multiplexer into digital format and supplying the data to the CPU 20 for analysis.

To effect cell voltage measurement, each of the plurality of differential amplifiers 62, 64, etc has a high common-mode rejection ratio. Each differential amplifier preferably is also highly linear. Each differential amplifier may have a gain of substantially unity. Each differential amplifier should also be able to reject as high a voltage as possible at each input. However, the input differential is limited by the power supply voltage as is commonly known in the art. Accordingly, the input differential may be limited to a range of +/−15V.

Figure 3:
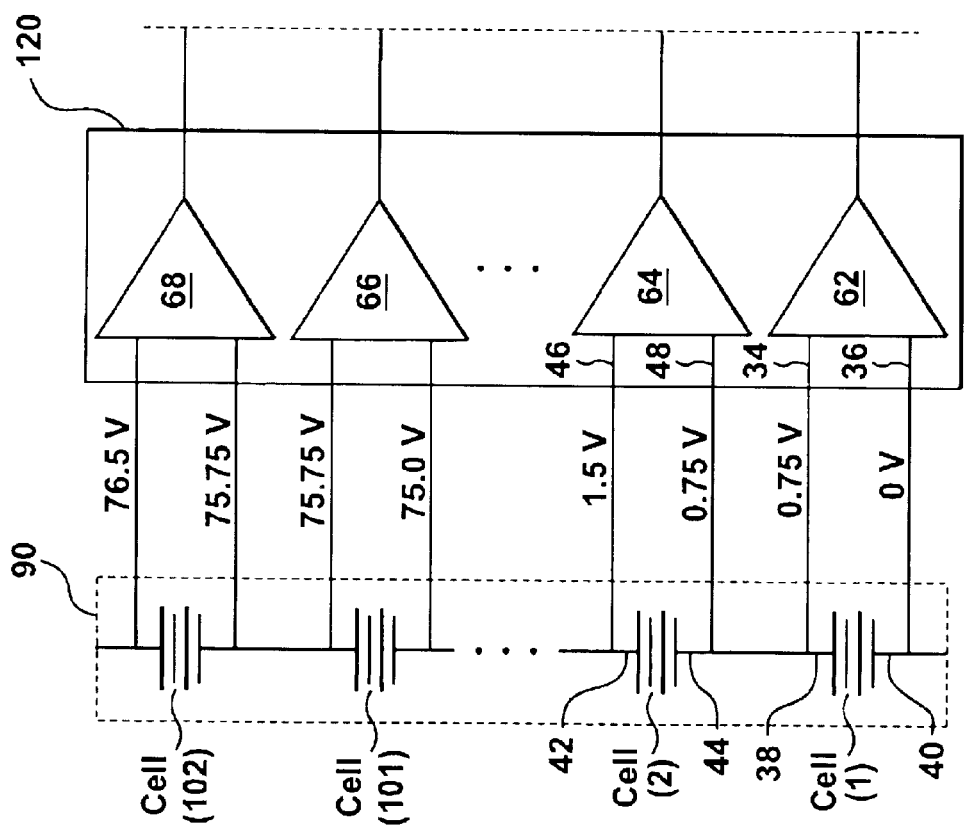
FIG. 3 is a partial schematic view of a cell voltage measurement on a fuel cell stack using the system shown in FIG. 1.

In FIGS. 1 and 3, the inputs of each differential amplifier 62, 64, etc are connected across one fuel cell. In particular, the two inputs 34, 36 of the amplifier 62 are connected to the anode 38 and cathode 40 of cell 1. Similarly, two inputs 46, 48 of the amplifier 64 are connected to the anode 42 and cathode 44 of cell 2. In this arrangement, the cell voltage, and hence the internal resistance of each fuel cell can be obtained. However, it is to be understood that in practice, the inputs of a differential amplifier do not necessarily have to be connected to the two terminals of one fuel cell. Rather, the inputs of the differential amplifier may be connected to any two terminals on the fuel cell stack 90. For instance, for differential amplifier 62, the input 36 may be connected to the terminal 40 of cell 1 and the input 34 may be connected to the terminal 42 of cell 2. Hence, the voltage drop and the internal resistance of a number of fuel cells within the stack 90 can be obtained, limited only by the maximum voltage differential that can be applied to any one amplifier. In this description, for simplicity, each differential amplifier is assumed to be connected to the terminals of a unique fuel cell.

As described above, the load bank 100 draws a DC current with an AC perturbation superimposed thereon. Therefore, the measured cell voltages consist of both DC and AC components. The channel splitting device 21 splits the voltage signal of the outputs of the plurality of differential amplifiers 62, 64, etc, (the primary channels) into first and second channels for the DC and AC components of the voltages across the individual cells, so that both DC and AC voltages can be accurately measured. The channel split is achieved in a manner known to those skilled in the art. For example, for the DC component a low pass filter is used while for AC component, a high pass filter is used. This also effectively doubles the number of channels that are measured (two channels per cell). As an example, the AC component may be extracted by applying a high-pass filter (not shown) in the channel splitting device 21. The switching network or multiplexer 22 then only allows one differential voltage signal, as measured at two points on the fuel cell stack 90 to be accessed at any one time. This configuration is desirable for reducing the number of components in the measuring system 100. The switching network 22 scans the outputs of the channel splitting device 21 to get a complete set of measurements of cell voltages. The scan can be done at a high speed so that only one cell voltage signal at a time is accepted.

Then the first A/D converter 70 sequentially converts the measured analog voltages to digital values. In practice, the first A/D converter 70, as well as the second A/D converter 75, may be a 16-bit converter. If desired, an A/D converter with more bits may be used to obtain more accurate digital values. The digital data are read by the CPU 20 from the first A/D converter 70, as well as the second A/D converter 75. The CPU 20 also controls the operation of the switching network 22 via a switching network control signal line 47, and, as noted, the first A/D converter 70 via a first A/D converter control signal 49, and the second A/D converter 75 via a second A/D converter control signal 45. The CPU 20 controls the switching network or multiplexer 22 to selectively receive the digital values for the cell voltage measured at two terminals of a specific fuel cell in the stack 90. Preferably, the CPU 20 directs the switching network 22 to access the measured cell voltages in sequential order and reads the corresponding digital values for the first A/D converter 70. Alternatively, the measured cell voltages can be accessed at any time by appropriately programming the CPU 20. How often cell voltages are measured is important for analysis of cell performance using the measured voltages and internal resistance. Cell voltage measurement must be sufficiently fast to report brief, transient conditions on the cells. It is preferred to perform a measurement every 10 ms on every cell, which has been shown to be more than sufficient; for a hundred cell stack, cell voltages would then be measured at 1 second increments for each stack.

The plurality of differential amplifiers 62, 64, etc used in the present invention may be chosen from any commercially available differential amplifier having a high common-mode rejection ratio. Examples include the Burr-Brown INA 117 differential amplifier or the Analog Devices AD 629 differential amplifier. These differential amplifiers can function with a common-mode voltage of up to 200V and can therefore be connected directly to the cathode and anode of a fuel cell from the fuel cell stack 90 as shown in FIG. 1.

In practice, the bank of differential amplifiers 120 requires calibration in order to obtain accurate voltage measurements. As is known to those skilled in the art, when the number of individual fuel cells in the fuel cell stack 90 increases, the voltages at the two terminals of a single fuel cell increases. This increase is larger the further away the single fuel cell is from the reference potential of the fuel cell stack 90. Accordingly, the common-mode voltage of the inputs of the differential amplifier connected to the single fuel cell also increases (the common-mode voltage is simply the average value of the inputs). The increase at the inputs of the differential amplifier results in a voltage at the output of the differential amplifier which will corrupt the voltage measurement of the differential amplifier. This common-mode voltage error is equal to the product of the common-mode voltage gain of the differential amplifier and the common-mode voltage of the inputs. Thus, the common-mode voltage error is proportional to the common-mode voltage of the inputs of the differential amplifier. Accordingly, the differential amplifier preferably has a high common-mode rejection ratio (CMRR) which is the ratio of the input voltage when the inputs are tied together divided by the output voltage. The CMRR is usually expressed in dB (i.e. CMRR (dB)=20 log (input voltage/output voltage)). Typically, values for CMRR are approximately in the range of 70 to 110 dB. An amplifier with a high common-mode rejection ration, by definition, has small common-mode voltage gain.

In addition, due to unavoidable internal mismatches in the differential amplifier, an extraneous voltage occurs at the output of the differential amplifier. This output voltage is referred to as the DC offset of the differential amplifier. The DC offset is observed as a finite voltage at the output of the differential amplifier when the inputs of the differential amplifier are connected to ground.

Furthermore, a voltage error can result in the measurement due to the quantization noise of the A/D converter 70. However, as is known in the art, the quantization noise can be reduced to an acceptable level by increasing the number of quantization bits in the A/D converter.

Due to the common-mode voltage error, the DC offset and to some extent the quantization noise, the output of the differential amplifier will deviate from the actual cell voltage of the fuel cell. This deviation is referred to as a residual voltage which is a measurement error that cannot be eliminated with common differential amplifier arrangements. As discussed previously, the residual voltage is proportional to the common-mode voltage of the inputs of the differential amplifier. This is not desirable since as the total number of individual fuel cells increases, the common-mode voltage of the inputs of the differential amplifiers increases. Therefore, the deviation in the measured cell voltage for those fuel cells at the top of the fuel cell stack 90 will be large enough to significantly affect the accuracy of the cell voltage measurement.

The above problem can be overcome if the measured voltage of the fuel cell is calculated based on a linear equation which uses the digital values obtained from the voltage measurement of each fuel cell. In order to perform the calculation, at least one voltmeter and a calibrator (both are not shown) are needed for reading voltage values during a calibration process. Preferably, the voltmeter is a high precision voltmeter.

The cell voltage for each fuel cell, measured by a given differential amplifier, can be calculated using the following equation:

$$V_R = V_A * V_{A/D}/[V_{A/D}(V_A) - V_{A/D}(V_0)] - V_{OFF} \quad (1)$$

Where: $V_R$ is the calibrated measured cell voltage;

$V_{A/D}$ is the output value of the A/D converter 70 during cell voltage measurement;

$V_A$ is the voltage applied differentially to the inputs of the differential amplifier during calibration;

$V_{A/D}(V_A)$ is the output value of the A/D converter 70 when $V_A$ is applied to the inputs of the differential amplifier during calibration;

$V_{A/D}(V_0)$ is the output value of the A/D converter 70 when the inputs of the differential amplifier are tied to ground during calibration;

$V_{OFF}$ is the voltage output of the differential amplifier when the inputs of the differential amplifier are tied to ground during calibration.

The above equation (1) removes the measurement errors to obtain the measured cell voltage for the fuel cell being measured. The voltage $V_{OFF}$ represents the DC offset and common-mode voltage errors. These errors are removed from the measured value since, based on the principle of superposition, the measured voltage will be the addition of the cell voltage plus these errors. Secondly, the factor $V_{A/D}/[V_{A/D}(V_A) - V_{A/D}(V_0)]$ is used to correlate the output of the A/D converter 70 to a meaningful value in Volts. This calculation may be carried out by CPU 20.

FIG. 3 illustrates the measurement error which occurs when measuring the cell voltage of a fuel cell, from the fuel cell stack 90, if calibration is not used. Assuming there are 102 fuel cells in the fuel cell stack 90 and that each fuel cell operates at 0.75V (i.e. the cell voltage is 0.75V), the actual common-mode voltage of the $102^{nd}$ fuel cell is 75.75V (i.e. 0.75*101) as shown in FIG. 3. If a residual voltage error of +50 mV occurs at the output of the differential amplifier 68 connected to the $102^{nd}$ fuel cell, the output of the differential amplifier 68 will be 0.8V (i.e. 0.75+0.05) instead of 0.75V and it has unity gain. Typically, it is expected that differential DC voltages can vary in the range up to 0.05 Volts.

Figure 4:
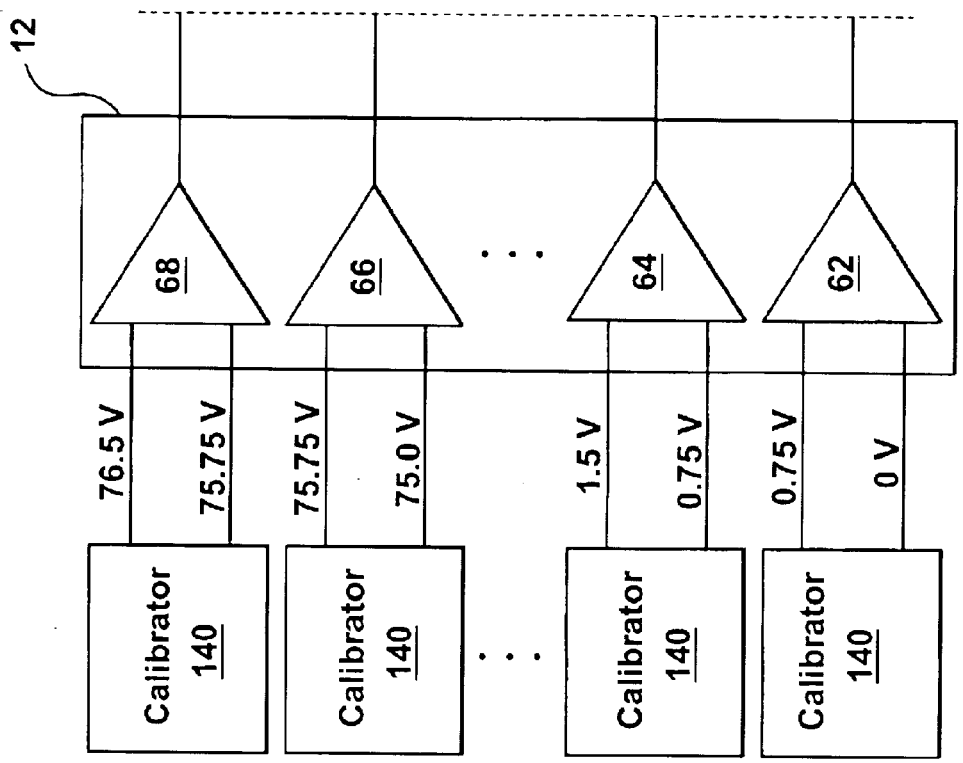
FIG. 4 is a partial schematic view of the calibration required for the measurement of cell voltage using the system shown in FIG. 1.

Referring now to FIG. 4, the measurement error can be eliminated by calibrating the differential amplifier 68 with a calibrator 140 that provides the exact common-mode voltage and the cell voltage that would be expected for $102^{nd}$ fuel cell which in this example are 75.75V and 0.75V respectively; as shown, a calibrator 140 can be used for each differential amplifier 68. When the calibrator is employed to calibrate the differential amplifier 68, the common-mode voltage error and the DC offset of the differential amplifier will be obtained. However, during actual measurement in normal usage, the output of the differential amplifier 68 will be the same as it was before calibration was performed (i.e. 0.80V in the example). Thus, the equation (1) must be used to obtain the actual cell voltage and significantly reduce the residual error.

Although it is difficult to anticipate the actual cell voltage of each fuel cell that will occur in use, it is known that individual fuel cells operate between approximately 0.5V to 1.0V during normal operation. By applying a calibrator that provides voltage levels close to these cell voltages, the plurality of differential amplifiers 62, 64, etc may be calibrated before they are used to measure the cell voltages. Therefore, the common-mode voltage error and the DC offset of each differential amplifier can be obtained. Consequently, by calibrating each differential amplifier, the accuracy of the fuel cell voltage measurement considerably increases.

Since individual fuel cells operate in the range of 0.5V to 1.0V, each fuel cell may be assumed to have a cell voltage of 0.75V. This is an average voltage at which fuel cells operate during normal use. Therefore, during calibration an increment of 0.75V is used which means the calibrator provides voltages as if the upper terminal of fuel cell 1 is at 0.75V, the upper terminal of fuel cell 2 is at 1.5V, the upper terminal of fuel cell 3 is at 2.25V, etc., and the upper terminal of fuel cell 101 is at 76.5V, as shown in FIG. 4. The inventors have found out that by using this method in practice, each differential amplifier was calibrated at a common-mode voltage which was closed to the actual common-mode voltage at the cell terminal of each fuel cell when each fuel cell was operating under ideal conditions. As a result, the measured cell voltages were close to the actual cell voltage of each fuel cell.

Although the calibration method does not completely eliminate the residual error, it significantly reduces the residual error and most notably the common-mode voltage error. Further, after calibration, the common-mode voltage error occurring during the voltage measurement of a given differential amplifier is no longer proportional to the common-mode voltage at the inputs of the differential amplifier. The common-mode voltage error is now proportional to the difference between the actual common-mode voltage at the inputs and the assumed common-mode voltage that as used for each fuel cell during calibration. Firstly, this difference will usually be relatively small. Further, this difference is random and does not increase as the number of fuel cells in the fuel cell stack 90. Therefore, the common-mode voltage error is maintained at a very low level during cell voltage measurement. This is particularly advantageous when measuring the cell voltage of fuel cells in a large fuel cell stack.

Now, referring back to FIG. 1, the measured cell voltages of individual fuel cells within the fuel cell stack 90 and the measured voltage drop of the shunt 110 are supplied to the CPU 20 in a digital format from the first and second A/D converters 70 and 75, respectively. In practice, the perturbation frequency ("spot" frequency) added to the load bank 100 is selected using the aforementioned method before the actual measurement so that the real impedance of each fuel cell can be obtained. A commonly used "spot" frequency is 1000 Hz. The perturbation amplitude is usually small, e.g. 10–20% of the full DC current drawn by the load bank 100. It is also to be understood that although in actual measurement, samples of the AC waveform of the cell voltages are often rejected, it is possible to configure the channel splitting device 21 so that a sampled AC waveform is retained and supplied to the CPU 20 for analysis, as may be desired. This would then enable information other than simple resistance to be obtained, i.e. information on the imaginary components of the cells impedances.

The present invention uses commonly available components which are inexpensive and do not require any hardware adjustments. The present invention also provides for a simple to use and highly precise measurement system. Furthermore, compared to existing cell voltage and resistance measuring systems, the present invention has fewer components which significantly reduces the overall size of the system. In addition, the present invention also allows for real-time measurement which can be continuously updated. The measurement can be automated to improve measurement speed and simplicity. This invention is particularly advantageous to measure each cell voltage or voltage drop of each group of fuel cells within a large fuel cell stack consisting of a large number of fuel cells.

It should be appreciated that although the present invention is primarily intended to measure fuel cell voltage and internal resistance, it is also applicable to measure the voltage and resistance of any kind of multi-cell electrochemical device, and examples of other such devices are batteries (both primary and secondary) and electrolyzers. For secondary or rechargeable batteries the present invention can be used to monitor battery characteristics in both charge and discharge modes.

Further, while the invention has been described with voltages being measured across individual fuel cells, it is not always necessary to measure the voltages across each cell. Depending upon the particular electrochemical device and its construction, it may in some case be desirable or sufficient to measure voltages across groups of cells, e.g. across groups of 2, 3 or 4 cells.

It should be further understood that various modifications can be made, by those skilled in the art, to the preferred embodiment described and illustrated herein, without departing from the present invention, the scope of which is defined in the appended claims.

What is claimed is:

1. An apparatus for measuring impedance and voltage characteristics of cells of a multi-cell electrochemical device, the apparatus comprising:

a voltage measuring means including a plurality of inputs for connection across a plurality of measuring points between cells of the electrochemical device, to generate voltage signals indicative of the measured voltages, the voltage measuring means providing a plurality of primary channels for the measured voltages, there being one channel for the voltage across adjacent measuring points; and wherein the voltage measuring means includes a channel splitter for separating out components of the measured voltages across adjacent measuring points from the primary channels, the channel splitter having first channels for providing DC components of the measured voltages and second channels for providing AC components of the measured voltages;

a load, connectable in series with the electrochemical device, and adapted to draw a DC current with a superimposed AC perturbation current; and a controller connected to and controlling the voltage measuring means and the load, for controlling the characteristics of the load and for receiving the voltage signals from the voltage measuring means, wherein the controller is adapted to control the load to provide desired DC and AC load current characteristics.

2. An apparatus as claimed in claim 1, wherein the voltage measuring means includes a plurality of instrumentation amplifiers each connected in parallel to the inputs of the voltage measuring means and having outputs providing the plurality of the primary channels and an analog multiplexer connected to at least the first channels from the channel splitter, wherein a multiplexer control line is connected between the controller and the analog multiplexer for controlling the analog multiplexer to switch sequentially between at least the first channels.

3. An apparatus as claimed in claim 2, which includes a first analog to digital converter connected to the output of the analog multiplexer, a voltage data bus connected between the first analog to digital converter and the controller and an analog to digital control line connected between the controller and the first analog to digital converter for control thereof.

4. An apparatus as claimed in claim 3, which includes a digital to analog converter having an analog output connected to the load, a load control line, a load data bus both connected between the controller and the digital to analog converter.

5. An apparatus as claimed in claim 4, wherein a shunt is provided connected in series with the load for measuring the current, wherein the shunt is connected to the controller.

6. An apparatus as claimed in claim 5, wherein outputs of the shunt are connected to a current amplifier and wherein the current amplifier has an output for a current measurement signal connected to the controller.

7. An apparatus as claimed in claim 6, wherein a current analog to digital converter is provided having an input connected to the output of the current amplifier and having a current output and a control input, and wherein a data bus connects the current output to the controller and an analog to digital control line is provided between the controller and the control input of the current analog to digital converter.

8. An apparatus as claimed in claims 1, 5 or 7, wherein the controller includes an input, connectable to another computing device for supply of control signals for controlling the controller.

9. A method of monitoring the voltage and impedance characteristics of cells of a multi-cell electrochemical device, the method comprising:

(i) providing a load connected in series with the electrochemical device;

(ii) controlling the load to provide desired current characteristics, comprising a desired combination of a DC current and a superimposed AC current perturbation, according to a series of set load conditions;

(iii) measuring the voltage across a plurality of measuring points between cells of the electrochemical device by providing a plurality of primary channels, there being one channel for the voltage across adjacent measuring points, and separating out components of the measured voltages across adjacent measuring points from the primary channels by providing at least one first channel for obtaining DC components of the measured voltage and at least one second channel for obtaining AC components of the measured voltages; and, (iv) recording at least some of the measured voltages.

10. A method as claimed in claim 9, which includes, between steps (i) and (ii), varying the frequency of the superimposed AC current perturbation, recording the voltages at selected frequencies for the superimpose AC current perturbation, and determining from the recorded voltages real and imaginary components of the impedance of the cells.

11. A method as claimed in claim 9, which includes connecting inputs of a plurality of differential amplifiers in parallel across adjacent measuring points between cells of the electrochemical device, measuring the voltages across adjacent measuring points between the cells with the plurality of differential amplifiers to generate a plurality of voltage signals, supplying the voltage signals to a multiplexer and operating the multiplexer to sequentially supply the voltage signals to the controller.

12. A method as claimed in claim 11, which includes converting each voltage signal selected by the analog multiplexer to a digital signal in a voltage analog to digital converter.

13. A method as claimed in claim 12, which includes providing a shunt connected in series with the load for measuring the current through the load, measuring the voltage across the shunt to determine the current through the load and thereby generating a current measurement signal and supplying the current measurement signal to the controller.

14. A method as claimed in claim 13, which includes converting the current measurement signal to a digital current measurement signal, and supplying the digital current measurement signal to the controller.

15. A method as claimed in claim 14, which includes supplying from the controller a digital load signal to a digital to analog converter, controlling the digital to analog converter with the controller and generating with the digital to analog converter an analog load control signal and supplying the analog load control signal to the load.

16. A method as claimed in claims 12, 13, 14 or 15, wherein each cell of the electrochemical device is calibrated, each voltage is measured across an individual cell of the electrochemical device, and the voltage for each cell is calculated in accordance with the following equation to give a calibrated measured cell voltage $V_R$:

$$V_R = V_A * V_{A/D} / [V_{A/D}(V_A) - V_{A/D}(V_0)] - V_{OFF} \quad (1)$$

where: $V_R$ Is the calibrated measured cell voltage;

$V_{A/D}$ is the output value of the voltage digital to analog converter for the respective cell during voltage measurement;

$V_A$ is a voltage applied differentially to the inputs of the differential amplifier for the respective cell, during calibration;

$V_{A/D}(V_A)$ is the output value of the voltage analog to digital converter when the voltage $V_A$ is applied to the inputs of the differential amplifier for the respective cell during calibration;

$V_{A/D}(V_0)$ is the output value of the voltage analog to digital converter when the inputs of the differential amplifier for the respective cell are tied to ground during calibration; and $V_{OFF}$ is the voltage output of the differential amplifier for the respective cell, when the inputs thereof are tied to ground during calibration.

* * * * *

UNITED STATES PATENT AND TRADEMARK OFFICE
CERTIFICATE OF CORRECTION

PATENT NO. : 6,816,797 B2
DATED : November 9, 2004
INVENTOR(S) : Freeman, Norman A. et al.

It is certified that error appears in the above-identified patent and that said Letters Patent is hereby corrected as shown below:

Column 1,
Line 14, the word -- a -- has been inserted before "system".

Column 2,
Line 3, the word "may" has been changed to -- many --.
Line 4, the word "on" has been changed to -- one --.

Column 4,
Line 15, the word "characteristic" has been changed to -- characteristics --.

Column 6,
Line 11, the word "a" has been changed to -- an --.
Line 24, the word "indicate" has been changed to -- indicated --.
Line 45, the word "dev" has been changed to -- device --.
Line 48 and 49, the word "converters" has been changed to -- converts --.

Column 8,
Line 36, the word "ration" has been changed to -- ratio --.

Column 11,
Line 51, a comma -- , -- has been inserted after "and".

Column 12,
Line 48, the word "voltage" has been changed to -- voltages --.
Line 55, the word "superimpose" has been changed to -- superimposed --.

Signed and Sealed this

Twenty-second Day of November, 2005

JON W. DUDAS
*Director of the United States Patent and Trademark Office*